United States Patent [19]
Held

[11] Patent Number: 5,712,573
[45] Date of Patent: Jan. 27, 1998

[54] NETWORK ANALYZER WITH ADAPTABLE SWEEP TIME BETWEEN MEASUREMENT POINTS

[75] Inventor: Werner Held, Pocking, Germany

[73] Assignee: Rohde & Schwarz GmbH & Co. KG, Munich, Germany

[21] Appl. No.: 638,178

[22] Filed: Apr. 26, 1996

[30] Foreign Application Priority Data

Jun. 22, 1995 [DE] Germany .................. 195 22 613.5

[51] Int. Cl.$^6$ ...................................... G01R 27/28
[52] U.S. Cl. ............................. 324/619; 324/76.27
[58] Field of Search .................. 324/76.12, 76.27, 324/618, 619, 650

[56] References Cited

U.S. PATENT DOCUMENTS

| | | | |
|---|---|---|---|
| 2,666,179 | 1/1954 | Maxwell | 324/618 |
| 3,800,184 | 3/1974 | Harzer et al. | 324/76.27 |
| 3,916,319 | 10/1975 | Hawley, Jr. et al. | 324/76.11 |
| 4,574,234 | 3/1986 | Inbar | 324/76.12 |
| 5,020,011 | 5/1991 | Stark et al. | 324/76.12 |
| 5,117,179 | 5/1992 | Wardle et al. | 324/76.27 |
| 5,307,284 | 4/1994 | Brunfeldt et al. | 324/76.12 |

FOREIGN PATENT DOCUMENTS 0 473 949 A2  11/1992  European Pat. Off. .

OTHER PUBLICATIONS

William L. Hale et al., "A Low Frequency Spectrum Analyzer That Makes Slow Sweeps Practiclal", Hewlett-Packard Journal, Sep. 1973, pp. 2–13.

*Primary Examiner*—Vinh P. Nguyen
*Assistant Examiner*—Glenn W. Brown

[57] ABSTRACT

In a network analyzer for the measurement of frequency-dependent measurement parameters of an object undergoing measurement, the waiting period at which the locked oscillator is switchable between the successive frequency measurement points is controlled in dependence on the comparison of at least two immediately successive measurement results at the same measurement point.

8 Claims, 1 Drawing Sheet

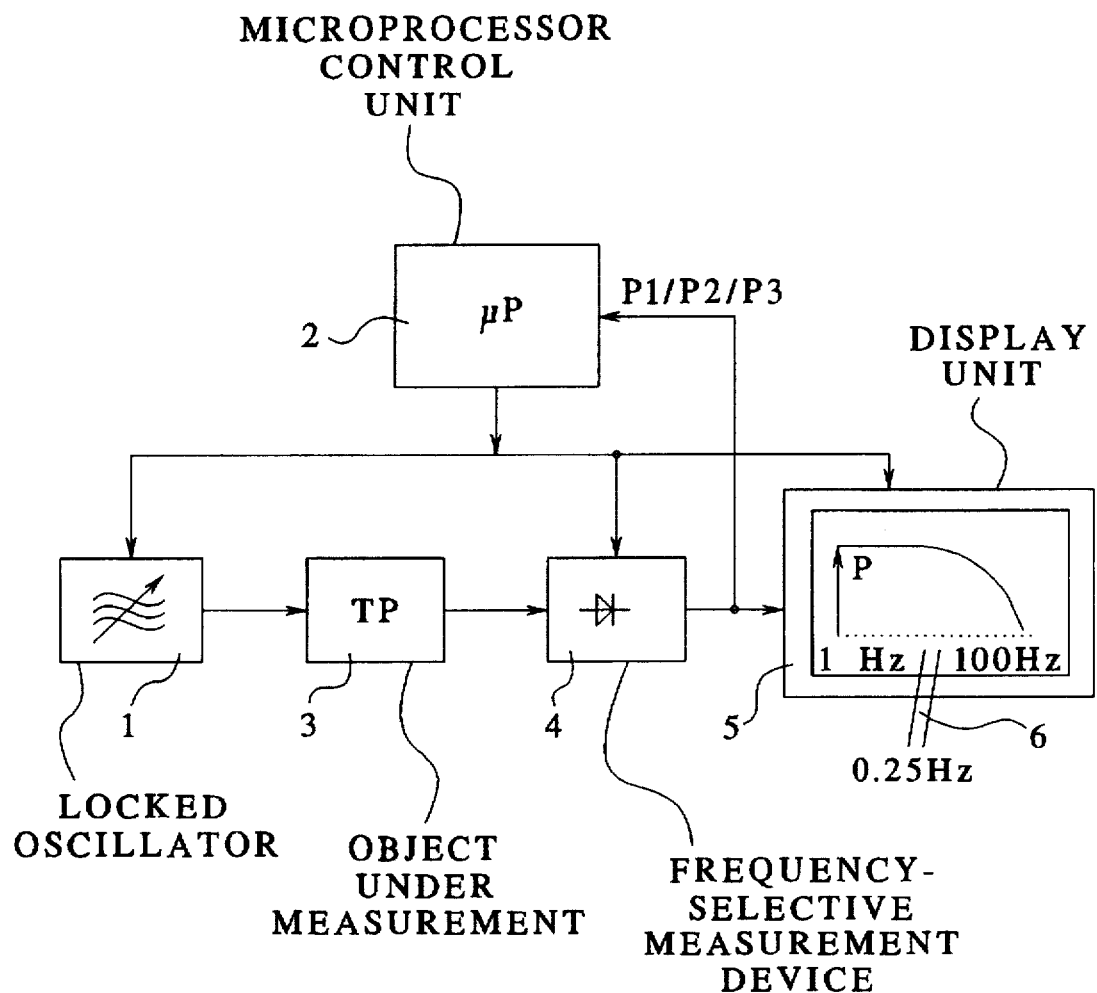

NETWORK ANALYZER WITH ADAPTABLE SWEEP TIME BETWEEN MEASUREMENT POINTS

BACKGROUND OF THE INVENTION

The invention concerns a network analyzer for the measurement of frequency-dependent measurement parameters of an object under measurement.

Network analyzers for the measurement and representation of frequency-dependent measurement parameters of an object under measurement are known, having a locked oscillator switchable in steps between successive measurement points in the frequency within a predetermined overall frequency band, and having a frequency-selective measurement device synchronously tunable with the locked oscillator, e.g. for the measurement of the level and/or the phase or other high-frequency measurement parameters at the output of an object under measurement supplied via the locked oscillator (European patent application 0 473 949). The so-called sweep time needed by the analyzer for the passing through of the overall frequency band is essentially determined, given wide-band objects of measurement, by the measurement speed of the network analyzer; but for narrow-band measurements, the sweep time is determined by the transient response of the overall system formed of the network analyzer and the object under measurement. For error-free measurements, given narrow-band measurement, the waiting period between successive measurement points (frequency steps) must be chosen to be large enough so that a full transient response still takes place, even at the frequency points at which the overall system exhibits the longest transient period.

In practice, for the measurement of the level curve of a lowpass in dependence on frequency, a waiting period of 100 ms between the successive measurement points is, for example, required so that the overall system has enough time for a transient response even at the filter edges, although in the pass band, in which practically no change in level occurs, a waiting time of such a length is not necessary. For the measurement of such a lowpass having e.g. 300 frequency measurement points, with a waiting period of 100 ms between successive measurement points (disregarding the very small actual measurement time per measurement point of e.g. only 100 µs), this yields a sweep time for the overall band of 30 s.

It is also already known to choose the sweep time in a network analyzer to be very large, and to carry out corresponding corrective measures in the intermediate frequency filter of the analyzer (U.S. Pat. No. 5,117,179). In this known solution, the chosen sweep time in the overall frequency band is also similarly large. Also, with this known solution, no errors that arise from the very fast sweep time in the measurement object itself can be compensated.

SUMMARY OF THE INVENTION

An object of the invention is to create a network analyzer in which the sweep time is limited to a minimum.

According to the invention, a waiting period between two successive measurement points for each individual measurement point is respectively matched to the transient response of the IF filter of the network analyzer and of the object under measurement, and thus to the transient response of the overall system. There thus result in the successive frequency steps of the overall frequency band respectively different waiting periods. Thus, during measurement of a lowpass with a small analyzer bandwidth, a relatively large waiting period matched to the transient response of the system is set at the filter edges at the measurement points located there, while subsequently in the pass band of the lowpass, the waiting period becomes a minimum, since here the transient period of the system is very small. The sweep time for the tuning of the overall frequency band is reduced to a minimum, and even narrow-band measurements can be carried out in a minimal measurement time.

BRIEF DESCRIPTION OF THE DRAWINGS

FIG. 1 is a block diagram of a network analyzer according to the invention.

The network analyzer according to the FIG. 1 is comprised of a locked oscillator 1 that is switchable in frequency steps between successive measurement points within an overall frequency band of e.g. 1 to 4000 MHZ via a control unit 2, for example a microprocessor. The measurement signals of the locked oscillator, thus generated stepwise and having different frequencies, are supplied to an object under measurement 3, whose output is connected to a frequency-selective measurement device 4, e.g. for the measurement of the level. The measurement device 4 is synchronously tunable with the locked oscillator 1 via the control unit 2, likewise in frequency steps. The measurement result is graphically presented on the screen of a display unit 5 or is digitally evaluated in the microprocessor 2. The number of measurement points and their distribution in the overall frequency band can be set at the control unit 2, as can the waiting period with which the locked oscillator is switched between the successive measurement points.

The measurement result of the measurement device 4 is evaluated in the control unit (microprocessor) 2 as follows, and is evaluated for the control of the waiting period for the switching of the locked oscillator 1 between the successive measurement points.

For the measurement of the forward lowpass characteristics in the frequency band of 1 to 100 Hz, the generation of e.g. 400 individual measurement points 6 is set at the control unit 2 by the locked oscillator 1, which points are in the example, generated at a uniform frequency distance of 0.25 Hz. The measurement takes place with a bandwidth of e.g. 1 Hz. The microprocessor 2 first sets the locked oscillator 1 to the first measurement point in the pass band of the lowpass, and the measurement device 4 carries out a first level measurement with a measurement time of e.g. 100 µs. Controlled by the microprocessor 2, a second measurement is carried out at the same first measurement point after a short time of e.g. only 1 ms, and this second measurement result P2 is compared with the first measurement result P1 in the microprocessor. If the difference between these two measurement results lies within a tolerance determined by the desired precision of the device, e.g. 0.05 dB, then the locked oscillator 1 is automatically switched via the microprocessor 2 to the next measurement point, since it has then been determined that the overall system comprised of the analyzer and the object under measurement has fully responded, which is the case for a lowpass in the pass band. However, if in comparing P1 and P2 it is determined that the difference in the two measurements still lies outside the predetermined tolerance, then the locked oscillator 1 is not yet switched further; rather, yet another measurement P3 is carried out at the same measurement point. These measurements at the same measurement point, carried out at an interval of e.g. 1 ms one after the other, are continued until the required tolerance is achieved. These repeated measurements are e.g. required at the falling edge of the lowpass, since here the overall system requires a longer time for transient response. In this way, for each individual measurement point the time in which the locked oscillator 1 is switched to the next measurement point (waiting period) is automatically matched to the frequency-dependent transient response of the overall system, and the sweep time for the overall frequency band is reduced to a minimum.

In order to prevent excessively large waiting times from arising in case of noise or oscillation of the measurement object, additional stepping criteria for this automatic measurement process are provided. One possibility is e.g. that the locked oscillator 1 is automatically switched via the microprocessor 2 to the next measurement point if a predetermined waiting period, set at the device, of e.g. 100 ms is exceeded. Another possibility is to derive this stepping criterion from the curve of the sizes of the successive measurement results P1, P2, P3 per measurement point. If, for example, it is determined that the individual measurement points P1, P2, P3 continually increase or decrease, this means that the transient response process is not yet concluded. If, on the other hand, an unsteadiness is determined with regard to the successive measurement results, this is to be traced back e.g. to noise or oscillation of the measurement object. In this case the locked oscillator 1 is then switched to the next measurement point.

Although various minor changes and modifications might be proposed by those skilled in the art, it will be understood that my wish is to include within the claims of the patent warranted hereon all such changes and modifications as reasonably come within my contribution to the art.

I claim as my invention:

1. A network analyzer for measurement of frequency-dependent measurement parameters of an object under measurement, comprising:

a locked oscillator connected to the object under test and which is switchable in frequency steps between successive measurement points within an overall frequency band;

a frequency selective measurement device for measuring an output from the object under test; and a control unit connected to said locked oscillator and said frequency selective measurement device for automatically changing without operator intervention a waiting period for said locked oscillator between successive frequency measurement points in dependence upon a comparison of at least two immediately successive measurement results output by said frequency selective measurement device at a same measurement point, and based on that comparison, deciding whether or not to switch the locked oscillator with a frequency step to the next successive measuring point.

2. A network analyzer according to claim 1 wherein said control unit determines the difference between measurement results obtained successively at same measurement point, and, if said difference lies outside a predetermined tolerance value, further measurements are carried out until said difference lies within said predetermined tolerance value, and then said control unit allows said locked oscillator to switch to a next frequency measurement point.

3. A network analyzer according to claim 2 wherein said control unit controls said locked oscillator so that it is automatically switched to said next frequency measurement point if an unsteadiness is determined in the comparison of the measurement results taken successively at same frequency measurement point.

4. A network analyzer according to claim 1 wherein said control unit permits said locked oscillator to automatically switch to a next frequency measurement point after a predetermined maximum time.

5. A network analyzer according to claim 1 wherein said control unit comprises a microprocessor.

6. A method for operating a network analyzer for measurement of frequency-dependent measurement parameters of an object under measurement, comprising the steps of:

switching a locked oscillator connected to said object under measurement in frequency steps between successive frequency measurement points within an overall frequency band;

measuring an output from the object under test with a frequency selective measurement device; and providing a control unit and automatically controlling with the control unit without operator intervention a waiting period by which the locked oscillator is switchable between the successive frequency measurement points in dependence on a comparison of at least two immediately successive measurement results at a same measurement point, and based on that comparison, deciding whether or not to switch the locked oscillator with a frequency step to the next successive measuring point.

7. A method according to claim 6 wherein the waiting period is matched to a transient response of the network analyzer at a current frequency measurement point.

8. A method for operating a network analyzer for measurement of frequency-dependent measurement parameters of an object under measurement, comprising the steps of:

switching a locked oscillator connected to said object under measurement in frequency steps between successive frequency measurement points within an overall frequency band;

measuring an output from the object under test with a frequency selective measurement device; and providing a control unit and automatically controlling with the control unit without operator intervention a waiting period determined by whether or not the locked oscillator is switched to the next successive frequency measurement point so that the waiting period is matched to a transient response of the network analyzer at a current frequency measurement point.

* * * * *